United States Patent
Pendharkar et al.

(10) Patent No.: US 8,933,461 B2
(45) Date of Patent: Jan. 13, 2015

(54) III-NITRIDE ENHANCEMENT MODE TRANSISTORS WITH TUNABLE AND HIGH GATE-SOURCE VOLTAGE RATING

(71) Applicant: Texas Instruments Incorporated, Dallas, TX (US)

(72) Inventors: Sameer Pendharkar, Allen, TX (US); Naveen Tipirneni, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 98 days.

(21) Appl. No.: 13/886,410

(22) Filed: May 3, 2013

(65) Prior Publication Data

US 2014/0042452 A1 Feb. 13, 2014

Related U.S. Application Data

(60) Provisional application No. 61/681,298, filed on Aug. 9, 2012.

(51) Int. Cl.

| | | |
|---|---|---|
| H01L 31/0256 | (2006.01) | |
| H01L 21/336 | (2006.01) | |
| H01L 29/20 | (2006.01) | |
| H01L 29/66 | (2006.01) | |
| H01L 29/778 | (2006.01) | |
| H01L 21/8252 | (2006.01) | |
| H01L 21/8258 | (2006.01) | |
| H01L 27/06 | (2006.01) | |
| H01L 29/423 | (2006.01) | |
| H01L 29/10 | (2006.01) | |

(52) U.S. Cl.
CPC ...... *H01L 29/2003* (2013.01); *H01L 29/66477* (2013.01); *H01L 29/7786* (2013.01); *H01L 21/8252* (2013.01); *H01L 21/8258* (2013.01); *H01L 27/0605* (2013.01); *H01L 29/42316* (2013.01); *H01L 29/4236* (2013.01); *H01L 29/1066* (2013.01)
USPC .......................................... 257/76; 438/197

(58) Field of Classification Search
CPC ............ H01L 21/8236; H01L 27/0883; H01L 29/7838
See application file for complete search history.

(56) References Cited

U.S. PATENT DOCUMENTS 7,952,392 B2    5/2011   Koyama et al.
8,264,003 B2 *  9/2012   Herman ........................ 257/194

(Continued)

FOREIGN PATENT DOCUMENTS

| JP | 07 321639 A | 12/1995 |
| JP | 10 336014 A | 12/1998 |
| JP | 2004 247754 A | 9/2004 |

*Primary Examiner* — Lex Malsawma
(74) *Attorney, Agent, or Firm* — Jacqueline J. Garner; Frederick J. Telecky, Jr.

(57) ABSTRACT

A semiconductor device includes an enhancement mode GaN FET with a depletion mode GaN FET electrically coupled in series between a gate node of the enhancement mode GaN FET and a gate terminal of the semiconductor device. A gate node of the depletion mode GaN FET is electrically coupled to a source node of the enhancement mode GaN FET. A source node of said enhancement mode GaN FET is electrically coupled to a source terminal of the semiconductor device, a drain node of the enhancement mode GaN FET is electrically coupled to a drain terminal of said semiconductor device, and a drain node of the depletion mode GaN FET is electrically coupled to a gate terminal of the semiconductor device.

20 Claims, 4 Drawing Sheets

(56) References Cited

U.S. PATENT DOCUMENTS

| | | | |
|---|---|---|---|
| 2001/0015437 A1* | 8/2001 | Ishii et al. ....................... 257/12 |
| 2006/0113593 A1* | 6/2006 | Sankin et al. .................. 257/341 |
| 2007/0215899 A1* | 9/2007 | Herman ........................ 257/147 |
| 2008/0230784 A1 | 9/2008 | Murphy |

\* cited by examiner

III-NITRIDE ENHANCEMENT MODE TRANSISTORS WITH TUNABLE AND HIGH GATE-SOURCE VOLTAGE RATING

CROSS-REFERENCE TO RELATED APPLICATIONS

This application claims the benefit of priority under U.S.C. §119(e) of U.S. Provisional Application 61/681,298 (filed Aug. 9, 2012, entitled "III-NITRIDE ENHANCEMENT MODE TRANSISTORS WITH TUNABLE AND HIGH GATE-SOURCE VOLTAGE RATING."

FIELD OF THE INVENTION

This invention relates to the field of semiconductor devices. More particularly, this invention relates to gallium nitride FETs in semiconductor devices.

BACKGROUND OF THE INVENTION

Field effect transistors (FETs) made of III-N materials such as GaN exhibit desirable properties for power switches, such as high bandgaps and high thermal conductivity compared to silicon FETs. However, enhancement mode GaN FETs with semiconductor gates are undesirably susceptible to excessive gate leakage current when the gates are overbiased. Similarly, enhancement mode GaN FETs with insulated gates are susceptible to gate dielectric breakdown when the gates are overbiased.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes an enhancement mode GaN FET with a gate of p-type semiconductor material or an insulated gate, and a depletion mode GaN FET electrically coupled in series between a gate node of the enhancement mode GaN FET and a gate terminal of the semiconductor device. A gate node of the depletion mode GaN FET is electrically coupled to a source node of the enhancement mode GaN FET.

During operation of the semiconductor device, a low gate bias which is below the maximum desired gate-source bias may be applied to the gate terminal of the semiconductor device; the low gate bias is transferred through the depletion mode GaN FET and applied to the gate node of the enhancement mode GaN FET with little voltage drop across the depletion mode GaN FET. A high gate bias which is above the maximum desired gate-source bias may be applied to the gate terminal of the semiconductor device; the high gate bias causes the depletion mode GaN FET to go into pinch-off mode so that the source node of the depletion mode GaN FET is maintained at the pinch-off voltage and the drain-source voltage drop across the depletion mode GaN FET increases with the high gate bias, and so the gate bias on the gate node of the enhancement mode GaN FET is maintained at the pinch-off voltage which is below the maximum desired gate-source bias.

DETAILED DESCRIPTION OF EXAMPLE EMBODIMENTS

Figure 1:
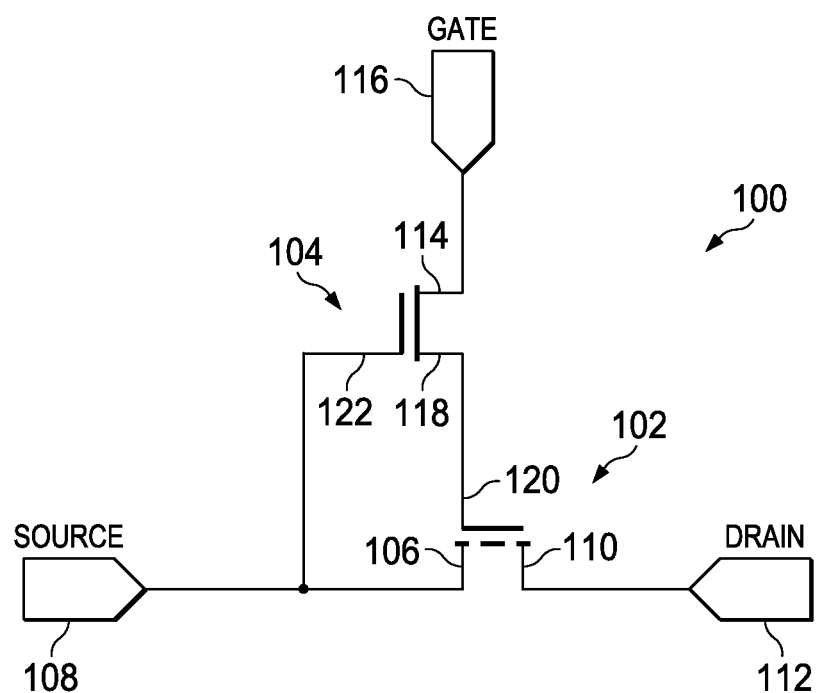
FIG. 1 is a circuit diagram of an exemplary semiconductor device.

The following co-pending patent applications are related and hereby incorporated by reference:

U.S. patent application Ser. No. 13/886,378 (filed simultaneously with this application, entitled "AVALANCHE ENERGY HANDLING CAPABLE III-NITRIDE TRANSISTORS;"

U.S. patent application Ser. No. 13/886,429 (filed simultaneously with this application, entitled "III-NITRIDE TRANSISTOR LAYOUT;"

U.S. patent application Ser. No. 13/886,652 (filed simultaneously with this application, entitled "LAYER TRANSFER OF SI100 ON TO III-NITRIDE MATERIAL FOR HETEROGENOUS INTEGRATION;"

U.S. patent application Ser. No. 13,886,688 (filed simultaneously with this application, entitled "RESURF III-NITRIDE HEMTS;"

U.S. patent application Ser. No. 13/886,709 (filed simultaneously with this application, entitled "METHOD TO FORM STEPPED DIELECTRIC FOR FIELD PLATE FORMATION;" and U.S. patent application Ser. No. 13/886,744 (filed simultaneously with this application, entitled "GaN DIELECTRIC RELIABILITY ENHANCEMENT."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device includes an enhancement mode GaN FET with a gate of p-type semiconductor material or an insulated gate, and a depletion mode GaN FET electrically coupled in series between a gate node of the enhancement mode GaN FET and a gate terminal of the semiconductor device. A gate node of the depletion mode GaN FET is electrically coupled to a source node of the enhancement mode GaN FET.

During operation of the semiconductor device, a low gate bias which is below the maximum desired gate-source bias may be applied to the gate terminal of the semiconductor device; the low gate bias is transferred through the depletion mode GaN FET and applied to the gate node of the enhancement mode GaN FET with little voltage drop across the depletion mode GaN FET. A high gate bias which is above the maximum desired gate-source bias may be applied to the gate terminal of the semiconductor device; the high gate bias causes the depletion mode GaN FET to go into pinch-off mode so that the source node of the depletion mode GaN FET is maintained at the pinch-off voltage and the drain-source voltage drop across the depletion mode GaN FET increases with the high gate bias, and so the gate bias on the gate node of the enhancement mode GaN FET is maintained at the pinch-off voltage which is below the maximum desired gate-source bias.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. III-N materials may be written with variable subscripts to denote a range of possible stoichiometries. For example, aluminum gallium nitride may be written as $Al_xGa_{1-x}N$ and indium aluminum gallium nitride may be written as $In_xAl_yGa_{1-x-y}N$. For the purposes of this description, the term GaN FET is understood to refer to a field effect transistor which includes III-N semiconductor materials.

FIG. 1 is a circuit diagram of an exemplary semiconductor device. The semiconductor device 100 includes an enhancement mode GaN FET 102 and a depletion mode GaN FET 104. A source node 106 of the enhancement mode GaN FET 102 is electrically coupled to a source terminal 108 of the semiconductor device 100. A drain node 110 of the enhancement mode GaN FET 102 is electrically coupled to a drain terminal 112 of the semiconductor device 100.

A drain node 114 of the depletion mode GaN FET 104 is electrically coupled to a gate terminal 116 of the semiconductor device 100. A source node 118 of the depletion mode GaN FET 104 is electrically coupled to a gate node 120 of the enhancement mode GaN FET 102. A gate node 122 of the depletion mode GaN FET 104 is electrically coupled to the source terminal 108 of the semiconductor device 100.

The gate node 120 of the enhancement mode GaN FET 102 may undesirably draw excessive current when a gate-source bias on the enhancement mode GaN FET 102 exceeds a maximum desired gate-source bias, for example, 5 volts. A threshold voltage of the enhancement mode GaN FET 102 is less than the maximum desired gate-source bias. A gate-source pinch-off voltage of the depletion mode GaN FET 104 is less than a maximum desired gate-source bias of the enhancement mode GaN FET.

Figure 2:
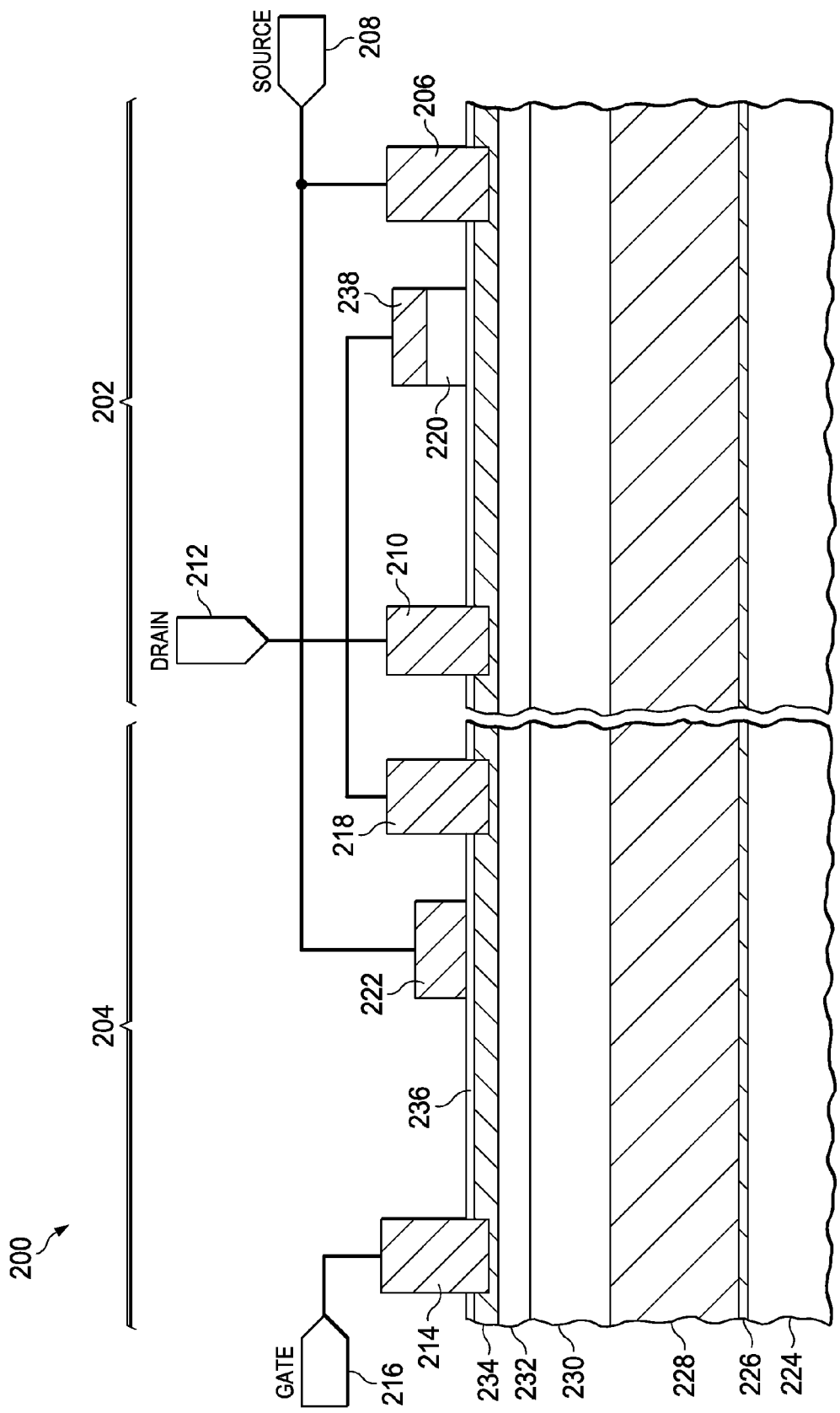
FIG. 2 through FIG. 4 are cross sections of exemplary semiconductor devices.
Figure 3:
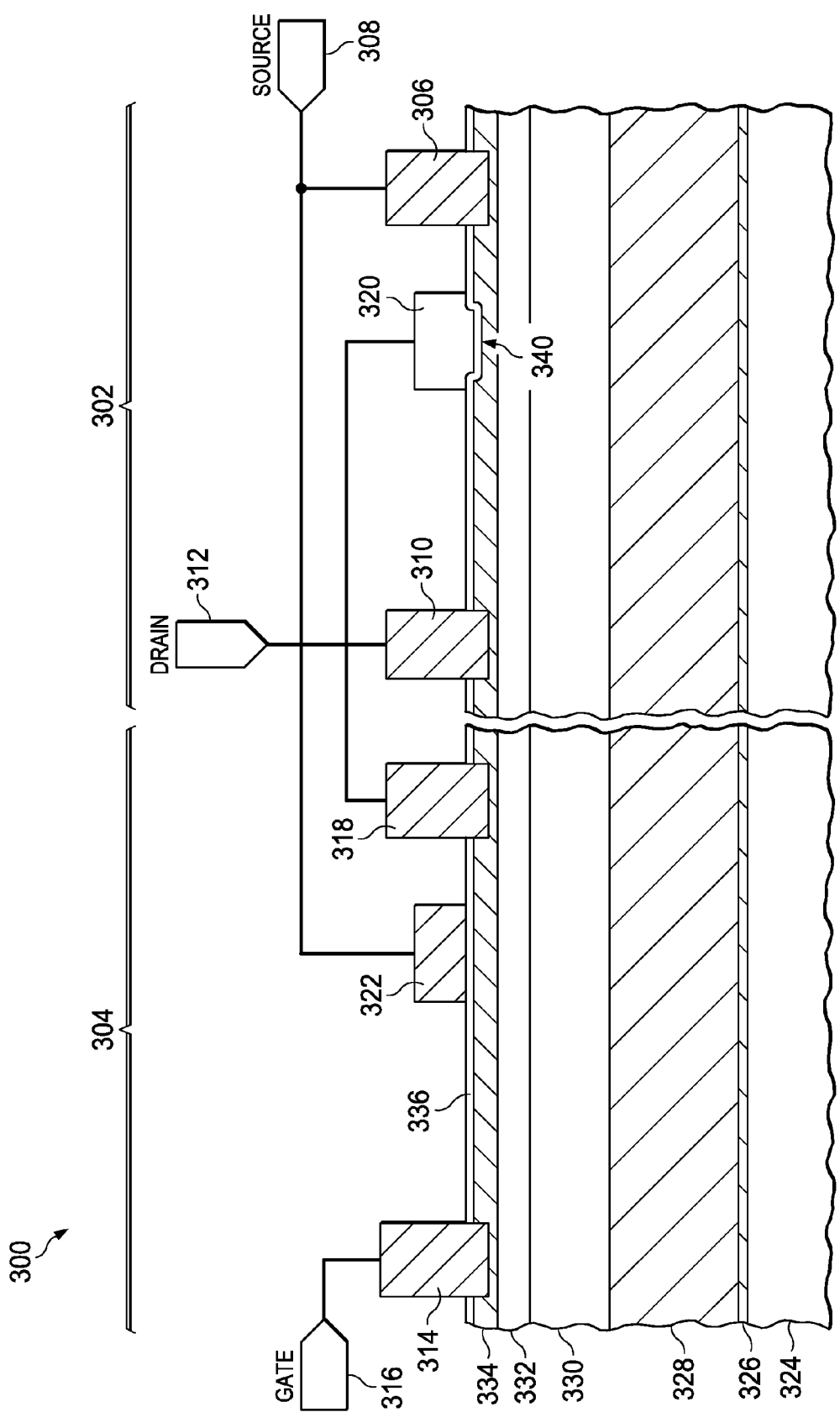
Figure 4:
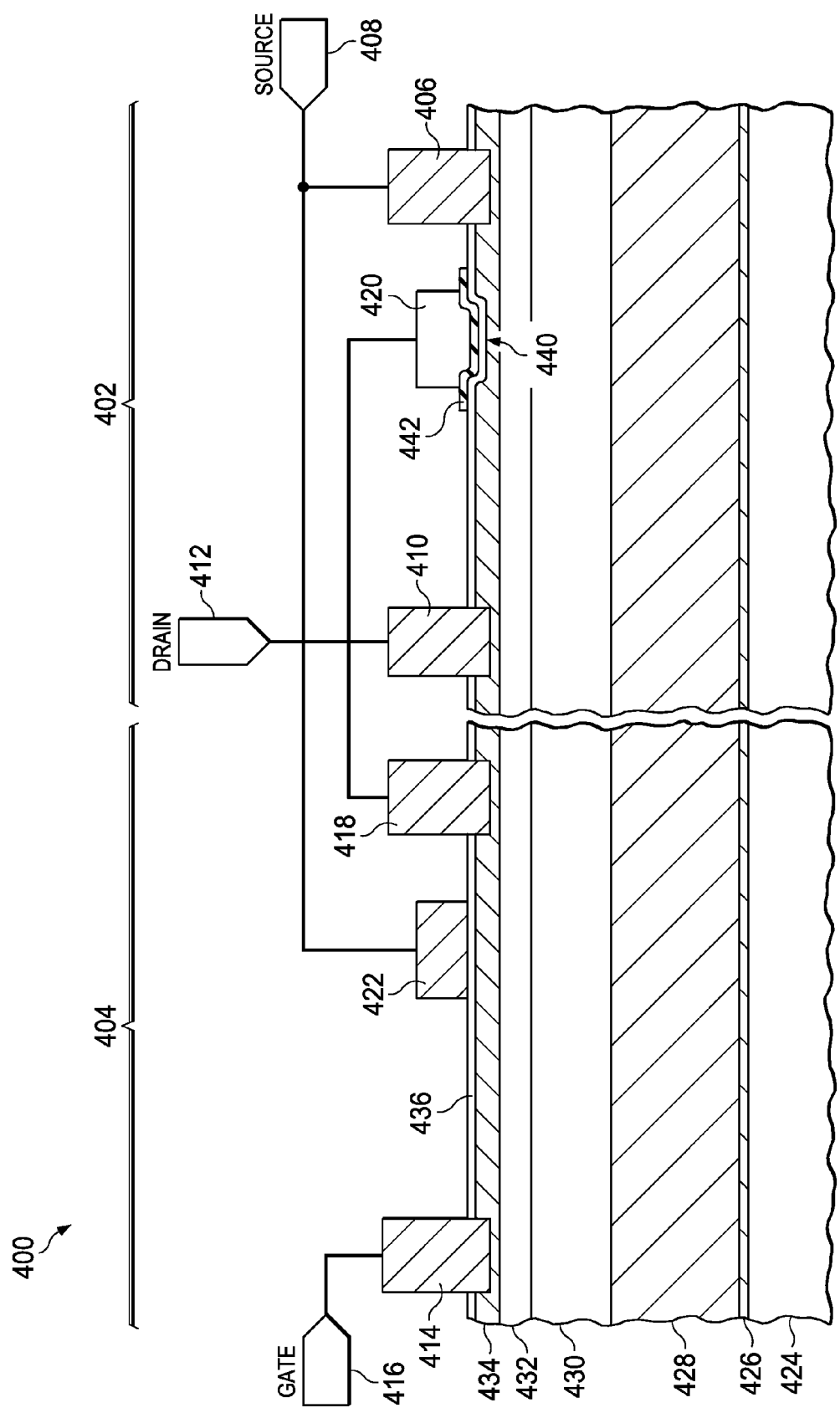

FIG. 2 through FIG. 4 are cross sections of exemplary semiconductor devices. Referring to FIG. 2, a semiconductor device 200 includes an enhancement mode GaN FET 202 and a depletion mode GaN FET 204. The enhancement mode GaN FET 202 is formed on a silicon substrate 224. A mismatch isolation layer 226 is formed on the silicon substrate 224. The mismatch isolation layer 226 may be, for example, 100 to 300 nanometers of aluminum nitride.

A buffer layer 228 is formed on the mismatch isolation layer 226. The buffer layer 228 may be, for example, 1 to 7 microns thick and include a stack of graded layers of $Al_xGa_{1-x}N$, which aluminum rich at the mismatch isolation layer 226 and is gallium rich at a top surface of the buffer layer 228.

An electrical isolation layer 230 is formed on the buffer layer 228. The electrical isolation layer 230 may be, for example, 300 to 2000 nanometers of semi-insulating gallium nitride. The electrical isolation layer 608 may be, for example, semi-insulating to provide a desired level of electrical isolation between layers above and below the electrical isolation layer 230.

A low-defect layer 232 is formed on the electrical isolation layer 230. The low-defect layer 232 may be, for example, 25 to 1000 nanometers of gallium nitride. The low-defect layer 232 may be formed so as to minimize crystal defects which may have an adverse effect on electron mobility, which may result in the low-defect layer 232 being doped with carbon, iron or other dopant species, for example with a doping density less than $10^{17}$ cm$^{-3}$.

A barrier layer 234 is formed on the low-defect layer 232. The barrier layer 234 may be, for example, 8 to 30 nanometers of $Al_xGa_{1-x}N$ or $In_xAl_yGa_{1-x-y}N$. A composition of group III elements in the barrier layer 234 may be, for example, 24 to 28 percent aluminum nitride and 72 to 76 percent gallium nitride. Forming the barrier layer 234 on the low-defect layer 232 generates a two-dimensional electron gas in the low-defect layer 232 just below the barrier layer 234 with an electron density of, for example, $1 \times 10^{12}$ to $2 \times 10^{13}$ cm$^2$.

An optional cap layer 236 may be formed on the barrier layer 234. The cap layer 236 may be, for example, 2 to 5 nanometers of gallium nitride. The cap layer 236 may reduce oxidation of the aluminum in the barrier layer 234.

An enhancement mode gate 220 is formed on the cap layer 236 if present or on the barrier layer 234 if no cap layer is formed. The enhancement mode gate 220 includes one or more layers of p-type III-N semiconductors, such as gallium nitride, gallium aluminum nitride, indium gallium aluminum nitride, indium aluminum nitride and aluminum nitride. The enhancement mode gate 220 may have a metal gate cap 238 which forms an ohmic or schottky contact to the enhancement mode gate 220 to improve electrical performance.

A source contact 206 is formed through the cap layer 236 and extending into the barrier layer 234, so as to form a tunneling connection to the two-dimensional electron gas in the low-defect layer 232 of the enhancement mode GaN FET 202. The source contact 206 may be laterally separated from the enhancement mode gate 220 by, for example, 500 to 1500 nanometers. Similarly, a drain contact 210 is formed through the cap layer 236 and extending into the barrier layer 234, so as to form a tunneling connection to the two-dimensional electron gas. The drain contact 210 is laterally separated from the enhancement mode gate 220 by a distance which depends on a maximum operating voltage of the enhancement mode GaN FET 202. For example, in an enhancement mode GaN FET 202 designed for a maximum operating voltage of 200 volts, the drain contact 210 may be laterally separated from the enhancement mode gate 220 by 2 to 8 microns. In an enhancement mode GaN FET 202 designed for a maximum operating voltage of 600 volts, the drain contact 210 may be laterally separated from the enhancement mode gate 220 by 5 to 20 microns.

The depletion mode GaN FET 204 may be formed on the same silicon substrate 224 as the enhancement mode GaN FET 202, using the same III-N layers: the mismatch isolation layer 226, the buffer layer 228, the electrical isolation layer 230, the low-defect layer 232, the barrier layer 234 and the optional cap layer 236 if present. A depletion mode gate 222 is formed on the cap layer 236 if present or on the barrier layer 234 if no cap layer is present. The depletion mode gate 222 may be formed of, for example, 100 to 300 nanometers of tungsten or titanium tungsten. The depletion mode gate 222 may be patterned using an etch process, or alternatively a liftoff process. A source contact 218 and a drain contact 214 are formed to make tunneling connections to the two-dimensional electron gas of the depletion mode GaN FET 204, as described in reference to the enhancement mode GaN FET 202.

The enhancement mode GaN FET 202 and/or the depletion mode GaN FET 204 may be formed in and on a different layer structure that that depicted in FIG. 2. For example, the electrical isolation layer 230 may be omitted so that the barrier layer 234 is formed on the buffer layer 228. A sapphire or silicon-on-insulator substrate may be used in placed of the silicon substrate 224.

The enhancement mode gate 220, the source contact 206 and the drain contact 210 of the enhancement mode GaN FET 202, and the depletion mode gate 222 and the source contact 218 and the drain contact 214 of the depletion mode GaN FET 204 are electrically coupled to each other and to a gate terminal 216, a source terminal 208 and a drain terminal 212 of the semiconductor device 200 as described in reference to the circuit diagram of FIG. 1. Electrical coupling may be accomplished, for example, by forming layers of dielectric and patterned metal interconnects.

In one configuration of the semiconductor device 200, the silicon substrate 224 may be electrically coupled to the source terminal 208. In another configuration, the silicon substrate 224 may be electrically coupled to the drain terminal 212. In a further configuration, the silicon substrate 224 may be electrically isolated from the source terminal 208 and the drain terminal 212.

In an alternate version of the instant example, the depletion mode GaN FET 204 may be formed on a separate substrate from the enhancement mode GaN FET 202 and may further have a different layer structure of III-N semiconductor materials. In such a version, electrical coupling may be accomplished, for example, by wire bonding or by mounting the enhancement mode GaN FET 202 and the depletion mode GaN FET 204 in a multi-chip carrier with electrically conductive leads.

Referring to FIG. 3, a semiconductor device 300 includes an enhancement mode GaN FET 302 and a depletion mode GaN FET 304. The enhancement mode GaN FET 302 is formed on a silicon substrate 324, for example with a mismatch isolation layer 326, a buffer layer 328, a electrical isolation layer 330, an low-defect layer 332, a barrier layer 334 and possibly an optional cap layer 336, as described in reference to FIG. 2. A source contact 306 and a drain contact 310 are formed to make tunneling connections to the two-dimensional electron gas of the enhancement mode GaN FET 302, as described in reference to the enhancement mode GaN FET 202 of FIG. 2.

In the enhancement mode GaN FET 302, a recess 340 is formed in the barrier layer 334 under an enhancement mode gate 320 before the optional cap layer 336 and the enhancement mode gate 320 are formed. A bottom of the recess 340 may be, for example, 5 to 15 nanometers above a top surface of the low-defect layer 332. The cap layer 336 and the enhancement mode gate 320 are substantially conformal in the recess 340. Forming the enhancement mode gate 320 in the recess 340 may advantageously provide a lower threshold voltage for the enhancement mode GaN FET 302.

The depletion mode GaN FET 304 may be formed on the same silicon substrate 324 as the enhancement mode GaN FET 302, using the same III-N layers: the mismatch isolation layer 326, the buffer layer 328, the electrical isolation layer 330, the low-defect layer 332, the barrier layer 334 and the optional cap layer 336 if present. A depletion mode gate 322 of III-N semiconductor material is formed on the cap layer 336 if present or on the barrier layer 334 if no cap layer is present. The depletion mode gate 322 may be formed of, for example, 150 to 300 nanometers of III-N semiconductor material such as gallium nitride or aluminum gallium nitride. A source contact 318 and a drain contact 314 are formed to make tunneling connections to the two-dimensional electron gas of the depletion mode GaN FET 304, as described in reference to the enhancement mode GaN FET 302.

As noted above, the enhancement mode GaN FET 302 and/or the depletion mode GaN FET 304 may be formed in and on the same layer structure. Alternatively, the enhancement mode GaN FET 302 and/or the depletion mode GaN FET 304 may be formed in and on a different layer structure that that depicted in FIG. 3, for example as described in reference to FIG. 2.

The enhancement mode gate 320, the source contact 306 and the drain contact 310 of the enhancement mode GaN FET 302, and the depletion mode gate 322 and the source contact 318 and the drain contact 314 of the depletion mode GaN FET 304 are electrically coupled to each other and to a gate terminal 316, a source terminal 308 and a drain terminal 312 of the semiconductor device 300 as described in reference to the circuit diagram of FIG. 1. The silicon substrate 324 may be electrically coupled to the source terminal 308, the drain terminal 312, or isolated from the source terminal 308 and the drain terminal 312.

Referring to FIG. 4, a semiconductor device 400 includes an enhancement mode insulated gate GaN FET 402 and a depletion mode GaN FET 404. The enhancement mode insulated gate GaN FET 402 is formed on a silicon substrate 424, for example with a mismatch isolation layer 426, a buffer layer 428, a electrical isolation layer 430, an low-defect layer 432, a barrier layer 434 and possibly an optional cap layer 436, as described in reference to FIG. 2. A source contact 406 and a drain contact 410 are formed to make tunneling connections to the two-dimensional electron gas of the enhancement mode insulated gate GaN FET 402, as described in reference to the enhancement mode GaN FET 202 of FIG. 2.

In the enhancement mode insulated gate GaN FET 402, a recess 440 is formed in the barrier layer 434. The optional cap layer 436 and a gate dielectric layer 442 are formed in the recess 440, and an enhancement mode insulated gate 420 is formed on the gate dielectric layer 442. A bottom of the recess 440 may be, for example, 5 to 15 nanometers above a top surface of the low-defect layer 432. Forming the enhancement mode insulated gate 420 in the recess 440 may advantageously provide a lower threshold voltage for the enhancement mode insulated gate GaN FET 402.

The depletion mode GaN FET 404 may be formed on the same silicon substrate 424 as the enhancement mode insulated gate GaN FET 402, using the same III-N layers: the mismatch isolation layer 426, the buffer layer 428, the electrical isolation layer 430, the low-defect layer 432, the barrier layer 434 and the optional cap layer 436 if present. A depletion mode gate 422 of III-N semiconductor material is formed on the cap layer 436 if present or on the barrier layer 434 if no cap layer is present. The depletion mode gate 422 may be formed of, for example, 150 to 300 nanometers of III-N semiconductor material such as gallium nitride or aluminum gallium nitride, or may be a metal gate as described in reference to FIG. 2. A source contact 418 and a drain contact 414 are formed to make tunneling connections to the two-dimensional electron gas of the depletion mode GaN FET 404, as described in reference to the enhancement mode insulated gate GaN FET 402.

As noted above, the enhancement mode insulated gate GaN FET 402 and/or the depletion mode GaN FET 404 may be formed in and on the same layer structure. Alternatively, the enhancement mode insulated gate GaN FET 402 and/or the depletion mode GaN FET 404 may be formed in and on a different layer structure that that depicted in FIG. 4, for example as described in reference to FIG. 2.

The enhancement mode gate 420, the source contact 406 and the drain contact 410 of the enhancement mode insulated gate GaN FET 402, and the depletion mode gate 422 and the source contact 418 and the drain contact 414 of the depletion mode GaN FET 404 are electrically coupled to each other and to a gate terminal 416, a source terminal 408 and a drain terminal 412 of the semiconductor device 400 as described in reference to the circuit diagram of FIG. 1. The silicon substrate 424 may be electrically coupled to the source terminal 408, the drain terminal 412, or isolated from the source terminal 408 and the drain terminal 412.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
    an enhancement mode GaN FET; and
    a depletion mode GaN FET;
    in which:
        a source node of said enhancement mode GaN FET is electrically coupled to a source terminal of said semiconductor device;
        a drain node of said enhancement mode GaN FET is electrically coupled to a drain terminal of said semiconductor device;
        a gate node of said enhancement mode GaN FET is electrically coupled to a source node of said depletion mode GaN FET;
        a gate node of said depletion mode GaN FET is electrically coupled to said source node of said enhancement mode GaN FET; and
        a drain node of said depletion mode GaN FET is electrically coupled to a gate terminal of said semiconductor device.

2. The semiconductor device of claim 1, in which a gate of said enhancement mode GaN FET includes a layer of p-type III-N semiconductor material on a barrier layer on an low-defect layer of gallium nitride.

3. The semiconductor device of claim 2, in which said gate of said enhancement mode GaN FET includes a layer of metal on said layer of p-type III-N semiconductor material.

4. The semiconductor device of claim 1, in which a gate of said enhancement mode GaN FET is an insulated gate.

5. The semiconductor device of claim 1, in which said enhancement mode GaN FET includes a recess in a barrier layer on an low-defect layer of gallium nitride, and a gate of said enhancement mode GaN FET is disposed in said recess.

6. The semiconductor device of claim 1, in which said enhancement mode GaN FET includes a cap layer of gallium nitride on a barrier layer on an low-defect layer of gallium nitride.

7. The semiconductor device of claim 1, in which said depletion mode GaN FET includes an low-defect layer of gallium nitride and a barrier layer on said low-defect layer, said barrier layer including a semiconductor material selected from the group consisting of $Al_xGa_{1-x}N$ and $In_xAl_yGa_{1-x-y}N$.

8. The semiconductor device of claim 1, in which said depletion mode GaN FET includes a depletion mode gate of metal.

9. The semiconductor device of claim 1, in which said depletion mode GaN FET includes a depletion mode gate of III-N semiconductor material.

10. The semiconductor device of claim 1, in which said depletion mode GaN FET and said enhancement mode GaN FET are formed on a same substrate and same layer structure of III-N semiconductor materials.

11. A process of forming a semiconductor device, comprising the steps of:
    forming an enhancement mode GaN FET by a process comprising the steps of:
        forming a first low-defect layer comprising gallium nitride over a first substrate;
        forming a first barrier layer comprising aluminum gallium nitride over said low-defect layer, so that a two-dimensional electron gas is generated in said first low-defect layer, providing a conductive channel of said enhancement mode GaN FET;
        forming a enhancement mode gate over said first barrier layer; and
    forming a depletion mode GaN FET by a process comprising the steps of:
        forming a second low-defect layer comprising gallium nitride over a second substrate;
        forming a second barrier layer comprising aluminum gallium nitride over said second low-defect layer, so that a two-dimensional electron gas is generated in said second low-defect layer providing a conductive channel of said depletion mode GaN FET;
        forming a depletion mode gate over said second barrier layer; and
    electrically coupling a source node of said enhancement mode GaN FET to a source terminal of said semiconductor device;
    electrically coupling a drain node of said enhancement mode GaN FET to a drain terminal of said semiconductor device;
    electrically coupling said enhancement mode gate of said enhancement mode GaN FET to a source node of said depletion mode GaN FET;
    electrically coupling said depletion mode gate of said depletion mode GaN FET to said source node of said enhancement mode GaN FET; and
    electrically coupling a drain node of said depletion mode GaN FET to a gate terminal of said semiconductor device.

12. The process of claim 11, in which said step of forming said enhancement mode GaN FET includes forming a gate of said enhancement mode GaN FET by forming a layer of p-type III-N semiconductor material on a barrier layer on an low-defect layer of gallium nitride.

13. The process of claim 12, further including forming a layer of metal on said layer of p-type III-N semiconductor material of said gate of said enhancement mode GaN FET.

14. The process of claim 11, in which said step of forming said enhancement mode GaN FET includes forming an insulated gate of said enhancement mode GaN FET by forming a metal gate over a gate dielectric layer over a barrier layer on an low-defect layer of gallium nitride.

15. The process of claim 11, in which said step of forming said enhancement mode GaN FET includes forming a recess in a barrier layer on an low-defect layer of gallium nitride, and forming a gate of said enhancement mode GaN FET in said recess.

16. The process of claim 11, in which said step of forming said enhancement mode GaN FET includes forming a cap layer of gallium nitride on a barrier layer on an low-defect layer of gallium nitride.

17. The process of claim 11, in which said step of forming said depletion mode GaN FET includes forming an low-defect layer of gallium nitride and a barrier layer on said low-defect layer, said barrier layer including a semiconductor material selected from the group consisting of $Al_xGa_{1-x}N$ and $In_xAl_yGa_{1-x-y}N$.

18. The process of claim 11, in which said step of forming said depletion mode GaN FET includes forming a depletion mode gate of metal.

19. The process of claim 11, in which said step of forming said depletion mode GaN FET includes forming a depletion mode gate of III-N semiconductor material.

20. The process of claim 11, in which said depletion mode GaN FET and said enhancement mode GaN FET are formed on a same substrate and same layer structure of III-N semiconductor materials.

* * * * *